(12) United States Patent
Wang et al.

(10) Patent No.: US 12,021,059 B2
(45) Date of Patent: Jun. 25, 2024

(54) WAFER-BONDING STRUCTURE AND METHOD OF FORMING THEREOF

(71) Applicant: Integrated Silicon Solution Inc., Milpitas, CA (US)

(72) Inventors: Hsingya Arthur Wang, Milpitas, CA (US); Sheng-Yuan Chou, Milpitas, CA (US); Yu-Ting Wang, Milpitas, CA (US); Wan-Yi Chang, Milpitas, CA (US)

(73) Assignee: INTEGRATED SILICON SOLUTION INC., Milpitas, CA (US)

( * ) Notice: Subject to any disclaimer, the term of this patent is extended or adjusted under 35 U.S.C. 154(b) by 289 days.

(21) Appl. No.: 17/488,503

(22) Filed: Sep. 29, 2021

(65) Prior Publication Data

US 2022/0020721 A1    Jan. 20, 2022

Related U.S. Application Data

(62) Division of application No. 16/824,843, filed on Mar. 20, 2020, now abandoned.

(51) Int. Cl.
*H01L 21/768* (2006.01)
*H01L 23/00* (2006.01)
*H01L 23/48* (2006.01)

(52) U.S. Cl.
CPC ........ *H01L 24/80* (2013.01); *H01L 21/76877* (2013.01); *H01L 21/76898* (2013.01); *H01L 23/481* (2013.01); *H01L 24/03* (2013.01); *H01L 24/05* (2013.01); *H01L 2224/05009* (2013.01); *H01L 2224/05147* (2013.01);
(Continued)

(58) Field of Classification Search
CPC .. H01L 21/768; H01L 24/80; H01L 21/76898
See application file for complete search history.

(56) References Cited

U.S. PATENT DOCUMENTS

| | | |
|---|---|---|
| 9,343,499 B1 | 5/2016 | Tai et al. |
| 9,673,169 B2 | 6/2017 | Teng et al. |
| 10,163,864 B1 | 12/2018 | England |

(Continued)

FOREIGN PATENT DOCUMENTS

| | | |
|---|---|---|
| TW | I528429 B | 4/2016 |
| TW | 201703241 A | 1/2017 |
| TW | 201911535 A | 3/2019 |

*Primary Examiner* — Dale E Page
*Assistant Examiner* — Wilner Jean Baptiste
(74) *Attorney, Agent, or Firm* — McClure, Qualey & Rodack, LLP

(57) ABSTRACT

A method of forming a wafer-bonding structure includes a wafer-bonding step, a through silicon via (TSV) forming step, and a forming bonding pad step. In the wafer-bonding step, at least two wafers are corresponding to and bonded to each other by bonding surfaces thereof. In the TSV forming step, a TSV structure is formed on at least one side of a seal ring structure of one of the wafers, a conductive filler is disposed in the TSV structure, and the TSV structure is overlapped the side of one of the seal ring structure of one of the wafers and a portion of a seal ring structure of another one of the wafers. In the forming bonding pad step, a bonding pad is formed on an outer surface which is relative to the bonding surface of the wafer with the TSV structure, so as to form the wafer-bonding structure.

5 Claims, 5 Drawing Sheets

(52) U.S. Cl.
CPC .............. *H01L 2224/05624* (2013.01); *H01L 2224/80009* (2013.01); *H01L 2224/80095* (2013.01)

(56) References Cited

U.S. PATENT DOCUMENTS

| | | | |
|---|---|---|---|
| 10,811,361 B2* | 10/2020 | Low | H01L 23/10 |
| 2009/0283871 A1* | 11/2009 | Chang | H01L 21/768 |
| | | | 257/E21.597 |
| 2012/0038028 A1 | 2/2012 | Yaung et al. | |
| 2012/0112322 A1* | 5/2012 | Lin | H01L 23/585 |
| | | | 257/E29.022 |
| 2016/0190103 A1* | 6/2016 | Kabe | H01L 23/564 |
| | | | 257/777 |

\* cited by examiner

WAFER-BONDING STRUCTURE AND METHOD OF FORMING THEREOF

RELATED APPLICATIONS

The present application is a divisional application of the application Ser. No. 16/824,843, filed Mar. 20, 2020, which is herein incorporated by reference.

BACKGROUND

Technical Field

The present disclosure relates to a wafer-bonding structure and a method of forming thereof.

Description of Related Art

Nowadays, a wafer-bonding structure is well established technology for a wafer-level packaging. In a significant effort is focused on a wafer-level three-dimensional integration as a viable solution for increasing functionality and overcoming a bottleneck of a wire-bonding process.

However, an oxide is easily formed on a bonding surface of a wafer to increase a resistance of the wafer-bonding structure. Also, an edge chipping and a moisture penetration are easily happened during sawing the wafer-bonding structure. Hence, decreasing an effect of the oxide formed on the bonding surface and avoiding the edge chipping and the moisture penetration as possible are important for the wafer-bonding structure.

SUMMARY

According to one aspect of the present disclosure, a method of forming a wafer-bonding structure includes a wafer-bonding step, a through silicon via (TSV) forming step, and a forming bonding pad step. In the wafer-bonding step, at least two wafers are corresponding to and bonded to each other by bonding surfaces thereof. In the TSV forming step, a TSV structure is formed on at least one side of a seal ring structure of one of the wafers, a conductive filler is disposed in the TSV structure, and the TSV structure is overlapped the side of the seal ring structure of one of the wafers and a portion of a seal ring structure of another wafer. In the forming bonding pad step, a bonding pad is formed on an outer surface which is relative to the bonding surface of the wafer with the TSV structure, so as to form the wafer-bonding structure.

According to another aspect of the present disclosure, a wafer-bonding structure includes at least two wafers, a through silicon via (TSV) structure, a conductive filler and a bonding pad. The wafers are bonded to each other, each of the wafers has a bonding surface, and each of the wafers includes a seal ring structure. The seal ring structure is disposed in the wafer, an end of the seal ring structure is connected to the bonding surface, and the other end of the seal ring structure is connected to an outer surface of the wafer. The TSV structure is passed through from the outer surface to the bonding surface in one of the wafers, wherein the TSV structure is connected to and overlapped at least one side of the seal ring structure of one of the wafers and a portion of the seal ring structure of another one of the wafers. The conductive filler is disposed in the TSV structure. The bonding pad is disposed on the outer surface of the wafer with the TSV structure.

BRIEF DESCRIPTION OF THE DRAWINGS

The present disclosure can be more fully understood by reading the following detailed description of the embodiment, with reference made to the accompanying drawings as follows.

DETAILED DESCRIPTION

Figure 1:
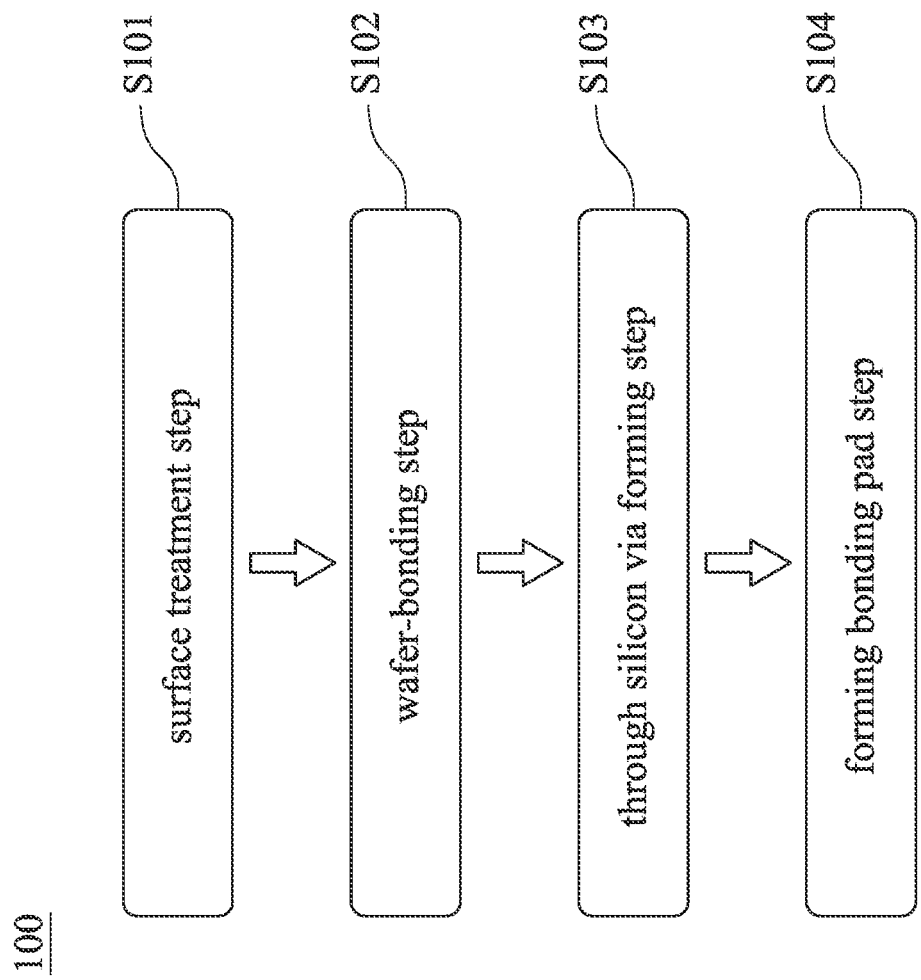
FIG. 1 is a step flow chart of a method of forming a wafer-bonding structure according to an embodiment of the present disclosure.

FIG. 1 is a step flow chart of a method of forming a wafer-bonding structure 100 according to an embodiment of the present disclosure. In FIG. 1, the method of forming the wafer-bonding structure 100 includes a surface treatment step S101, a wafer-bonding step S102, a through silicon via (TSV) forming step S103 and a forming bonding pad step S104.

Figure 2:
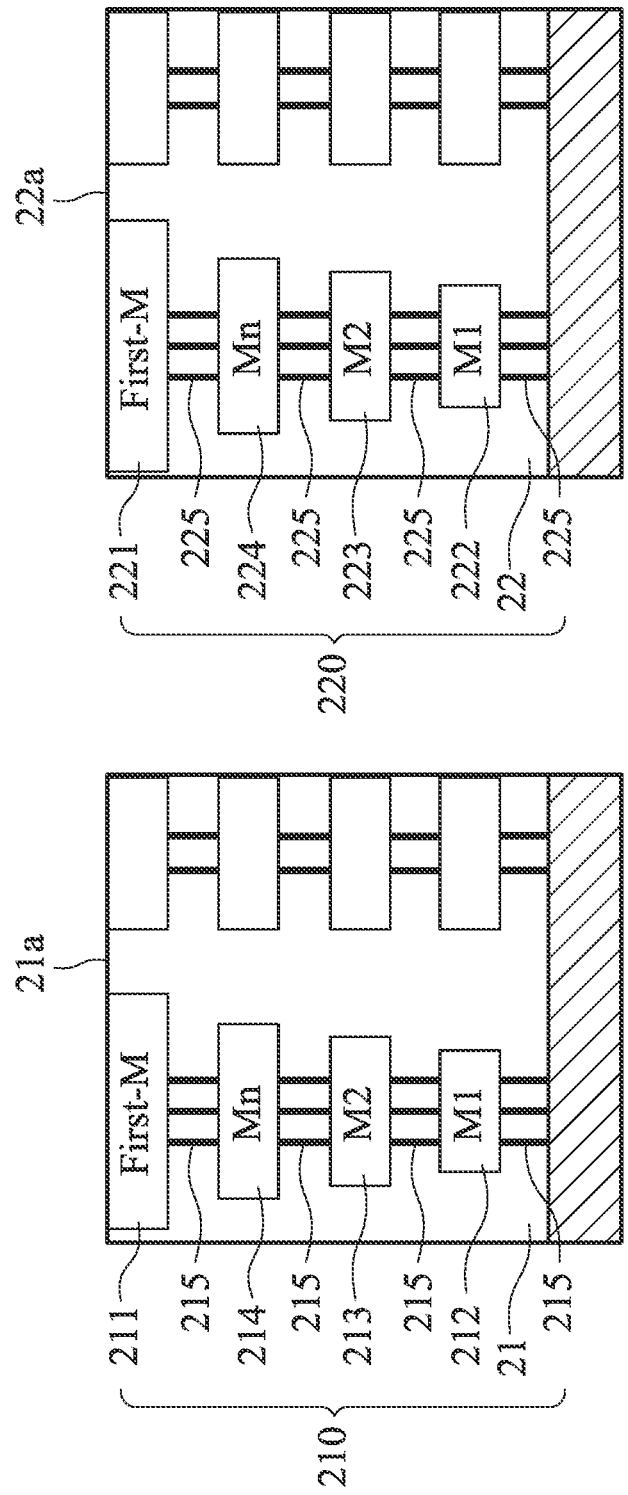
FIG. 2 is a schematic view of the surface treatment step according to the embodiment of FIG. 1.

FIG. 2 is a schematic view of the surface treatment step S101 according to the embodiment of FIG. 1. In FIGS. 1 and 2, a bonding surface of each of at least two wafers is performed a surface treatment before the wafer-bonding step S102. According to the embodiment of FIG. 1, a number of the wafers is two, but is not limited thereto. Further, the wafer 21 has the bonding surface 21a, and the wafer 22 has the bonding surface 22a. In detail, the surface treatment step S101 is to densify a silicon oxide (not shown) on the bonding surfaces 21a, 22a to avoid voids formed by the bonding surfaces 21a, 22a. Also, a roughness of the bonding surfaces 21a, 22a is less than 1.5 nm.

Figure 3:
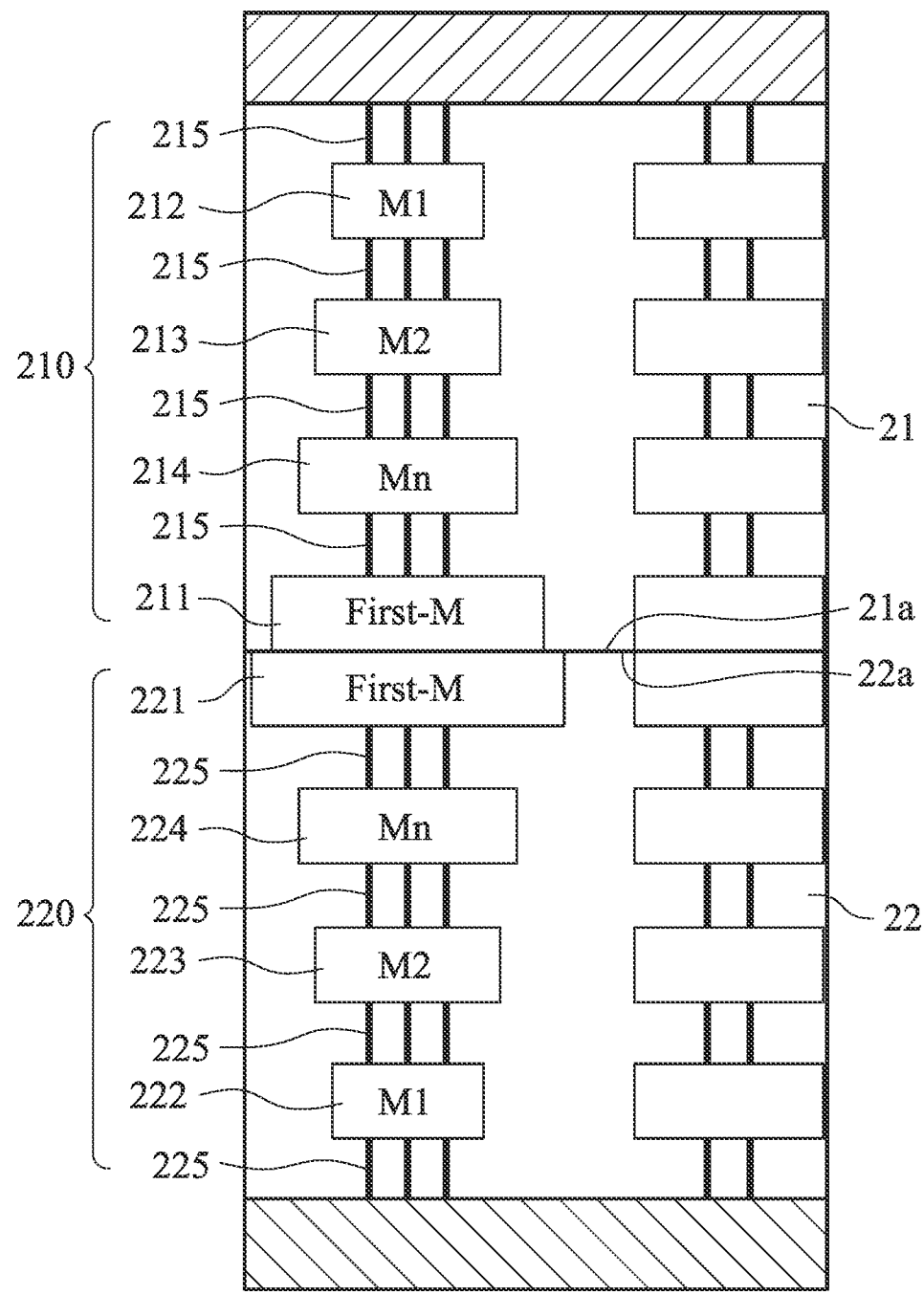
FIG. 3 is a schematic view of the wafer-bonding step according to the embodiment of FIG. 1.

FIG. 3 is a schematic view of the wafer-bonding step S102 according to the embodiment of FIG. 1. In FIGS. 1 and 3, each of the wafers 21, 22 are corresponding to and bonded to each other on the bonding surfaces 21a, 22a thereof. Each of the wafers has a seal ring structure. In detail, according to the embodiment of FIG. 1, the wafer 21 has a seal ring structure 210, the wafer 22 has a seal ring structure 220, and the seal ring structures 210, 220 are aligned to each other. Furthermore, an alignment accuracy of the wafer-bonding step S102 can be below 300 nm, but is not limited thereto. In detail, the alignment accuracy could be confirmed via a wafer testing structure.

Moreover, the wafer 21 includes the seal ring structure 210, and the wafer 22 includes the seal ring structure 220. Each of the seal ring structure 210 is corresponding to each of the seal ring structures 220. Furthermore, in the wafer-bonding step S102, the wafers 21, 22 are exposed to a nitrogen plasma or an oxygen plasma, and the wafers 21, 22 are bonded at 250° C. to 350° C. for 1 hour to 3 hours. Therefore, it is favorable for promoting a connecting strength between the wafers 21, 22.

Figure 4:
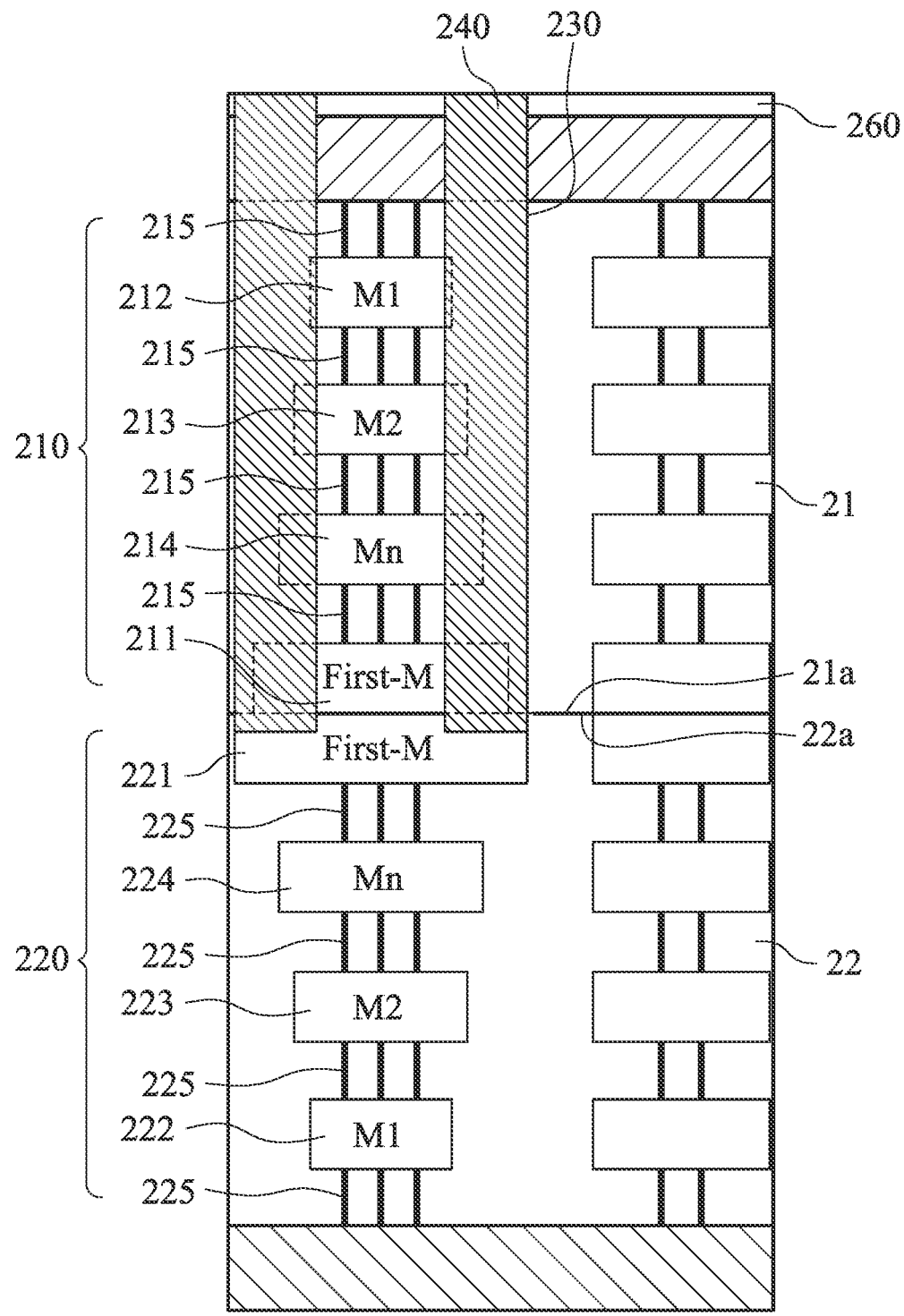
FIG. 4 is a schematic view of the through silicon via forming step according to the embodiment of FIG. 1.

FIG. 4 is a schematic view of the TSV forming step S103 according to the embodiment of FIG. 1. In FIGS. 1 and 4, a TSV structure 230 is formed on at least one side of a seal ring structure of one of the wafers 21, 22 after a formation of an oxide layer 260, a conductive filler 240 is disposed in the TSV structure 230, and the TSV structure 230 is overlapped the side of the seal ring structure of the wafer 21.

According to the embodiment of FIG. 1, the TSV structure 230 is formed on two sides of the seal ring structure 210 of the wafer 21, and the TSV structure 230 is overlapped the sides of the seal ring structure 210 of the wafer 21, but is not limited thereto. It should be mentioned that the TSV structure 230 overlapped the sides of the seal ring structure 210 of the wafer 21 is favorable for enhancing a mechanical protection and a humidity protection of the wafer-bonding structure 200.

Moreover, the TSV structure 230 is overlapped a portion of the seal ring structure 220 of the wafer 22. In detail, the TSV structure 230 is formed from an outer surface (its reference numeral is omitted) to the bonding surface 21a of the wafer 21. Therefore, the TSV structure 230 with the conductive filler 240 is favorable for improving a connecting strength between the wafers 21, 22. Also, an electrical resistance between the wafers 21, 22 can be decreased via the TSV structure 230 with the conductive filler 240.

In detail, the conductive filler 240 is disposed in the TSV structure 230 via a sputtering and plating process, and a chemical-mechanical polishing (CMP) is performed on the outer surface of the wafer 21 to avoid the outer surface of the wafer 21 being not uneven.

Figure 5:
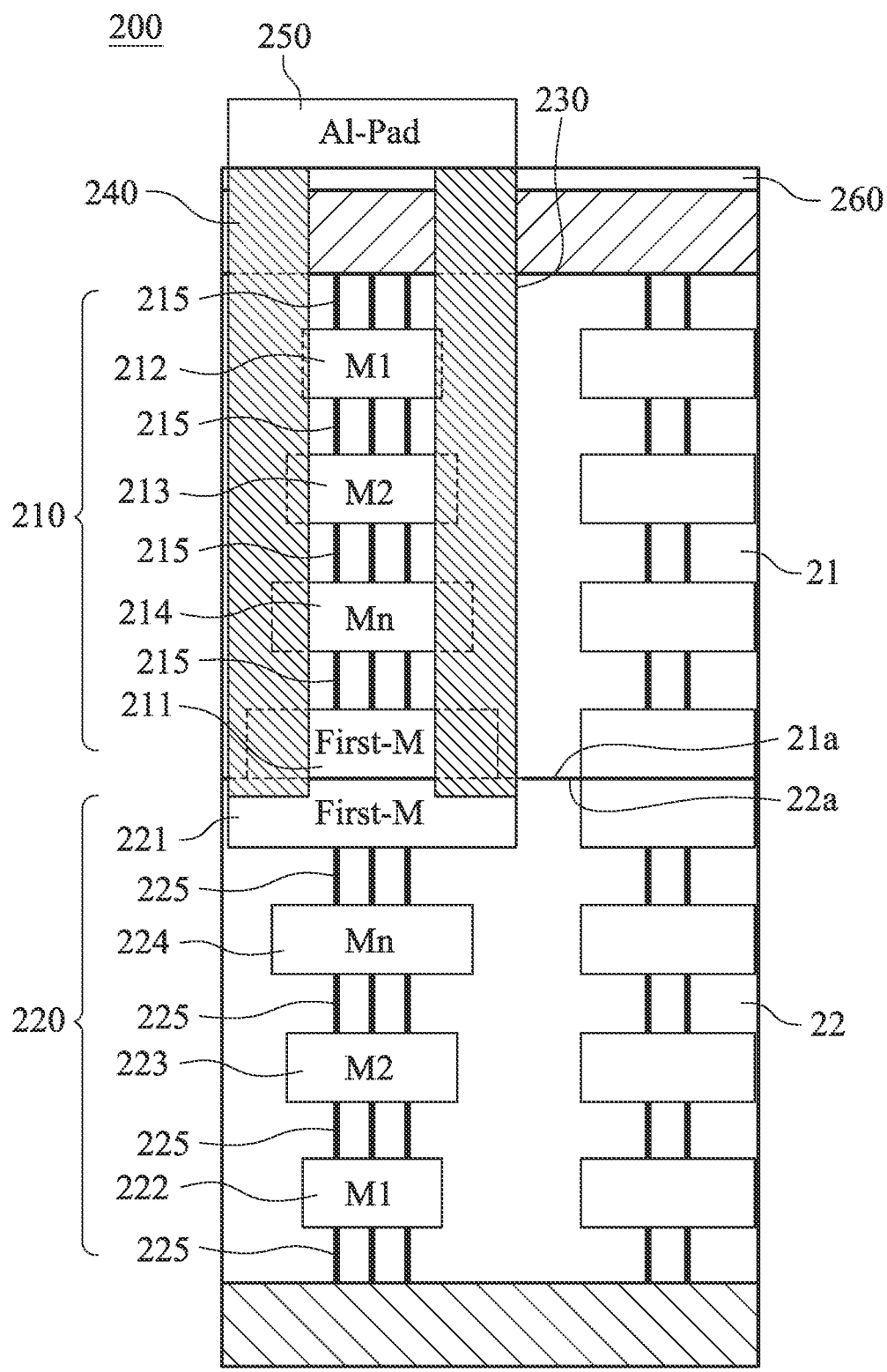
FIG. 5 is a schematic view of the forming bonding pad step according to the embodiment of FIG. 1.

FIG. 5 is a schematic view of the forming bonding pad step S104 according to the embodiment of FIG. 1. In FIGS. 1 and 5, a bonding pad 250 is formed on the outer surface which is relative to the bonding surface 21a of the wafer with the TSV structure 230, so as to form the wafer-bonding structure 200. According to the embodiment of FIG. 1, the bonding pad 250 is formed on the outer surface of the wafer 21 after the formation of an oxide layer 260 over the wafer-bonding structure 200, and the bonding pad 250 is for a wire-bonding process.

Via the method of forming the wafer-bonding structure, the connecting strength between the wafers can be stronger. Moreover, the resistant between the wafers can be decreased.

In FIG. 5, the wafer-bonding structure 200 of the present disclosure includes the wafers 21, 22, the TSV structure 230, the conductive filler 240, the bonding pad 250 and the oxide layer 260.

In detail, the wafers 21, 22 are bonded, the wafer 21 has the bonding surface 21a, and the wafer 22 has the bonding surface 22a. The wafer 21 includes the seal ring structure 210 disposed in the wafer 21, an end of the seal ring structure 210 is connected to the bonding surface 21a, and the other end of the seal ring structure 210 is connected to the outer surface of the wafer 21. The wafer 22 includes the seal ring structure 220 disposed in the wafer 22, a side of the seal ring structure 210 is connected to the bonding surface 22a, and the other side of the seal ring structure 220 is connected to an outer surface (its reference numeral is omitted) of the wafer 22.

The TSV structure 230 is passed through from the outer surface to the bonding surface in one of the at least two wafers, wherein the TSV structure 230 is connected to and overlapped at least one side of the seal ring structure of one of the wafers and a portion of the seal ring structure of another wafer. According to the embodiment of FIG. 5, the TSV structure 230 is passed through from the outer surface to the bonding surface 21a in the wafer 21, wherein the TSV structure 230 is connected to and overlapped the sides of the seal ring structure 210 of the wafer 21 and the portion of the seal ring structure 220 of wafer 22. In detail, the TSV structure 230 is connected to and overlapped a portion of the first metal layer 221, but is not limited thereto. Therefore, it is favorable for increasing the conductivity between the wafers 21, 22. The conductive filler 240 is disposed in the TSV structure 230. The bonding pad 250 is disposed on the outer surface of the wafer 21 with the TSV structure 230. The conductive filler 240 can be made of copper, but is not limited thereto.

In detail, the oxide layer 260 is disposed on the outer surface of the wafer 21 with the TSV structure 230, and the bonding pad 250 is disposed on the oxide layer 260. Further, the oxide layer 260 can be made of a silicon oxide, but is not limited thereto.

Furthermore, each of the seal ring structures can include a first metal layer, at least one metal layer and at least two pin sets. In detail, according to the embodiment of FIG. 5, the seal ring structure 210 includes the first metal layer 211, the metal layers 212, 213, 214 and the pin sets 215; the seal ring structure 220 includes the first metal layer 221, the metal layers 222, 223, 224 and the pin sets 225. The first metal layer 211 is connected to the bonding surface 21a, and the first metal layer 221 is connected to the bonding surface 22a. The metal layers 212, 213, 214 are disposed between the outer surface and the first metal layer 211, and the metal layers 222, 223, 224 are disposed between the outer surface and the first metal layer 221. One of the pin sets 215 is connected to the first metal layer 211 and the metal layer 214, another one of the pin sets 215 is connected to the metal layers 213, 214, another one of the pin sets 215 is connected to the metal layers 212, 213, and another one of the pin sets 215 is connected to the metal layer 212 and the outer surface. One of the pin sets 225 is connected to the first metal layer 221 and the metal layer 224, another one of the pin sets 225 is connected to the metal layers 223, 224, another one of the pin sets 225 is connected to the metal layers 222, 223, and another one of the pin sets 225 is connected to the metal layer 222 and the outer surface. According to the embodiment of FIG. 5, a number of the pin sets 215 is four, a number of the pin sets 225 is four, and the numbers of the pin sets 215, 225 are corresponding to the number of the metal layers 212, 213, 214, 222, 223, 224. Further, a number of the metal layer is not limited thereto. The first metal layers 211, 221 and the metal layers 212, 213, 214, 222, 223, 224 can be made of copper. The bonding pad 250 can be made of aluminum.

Furthermore, each of the pin sets 215, 225 includes at least three pins. A width of each of the pins can be larger than or equal to 0.025 μm, and a number of the pins is larger than or equal to three, but is not limited thereto. Therefore, it is favorable for avoiding an edge chipping and a moisture penetration during a sawing process.

Moreover, a width of the first metal layer 211 is larger than widths of the metal layers 212, 213, 214, and a width of the first metal layer 221 is larger than widths of the metal layers 222, 223, 224. In detail, the width of the metal layer 214 is larger than the width of the metal layer 213, and the width of the metal layer 213 is larger than the metal layer 212; the width of the metal layer 224 is larger than the width of the metal layer 223, and the width of the metal layer 223 is larger than the metal layer 222. Therefore, it is favorable for increasing a conductivity between the first metal layer and the metal layers.

In FIGS. 2 to 5, the width of the first metal layer 221 is larger than the width of the first metal layer 211. Therefore, the TSV structure 230 can go through to reach the wafer 22, and the TSV structure 230 can be straddled the portion of the first metal layer 221.

Further, a range of the TSV structure 230 straddled the first metal layer 211 can be larger than or equal to 0.05 μm, and a range of the TSV structure 230 straddled each of the metal layers 212, 213, 214 can be larger than or equal to 0.02 μm. In detail, the range of the TSV structure 230 straddled the metal layer 212 is larger than or equal to 0.02 μm, the range of the TSV structure 230 straddled the metal layer 213 is larger than or equal to 0.03 μm, and the range of the TSV structure 230 straddled the metal layer 214 is larger than or equal to 0.04 μm, but is not limited thereto. Therefore, it is favorable for increasing the conductivity between the wafers 21, 22.

Furthermore, a depth of the TSV structure 230 can be 2 μm to 20 μm, and a width of the TSV structure 230 can be 0.1 μm to 10 μm. Further, a depth of the TSV structure 230 can be 4 μm to 7 μm, but is not limited thereto. It is worth mentioning that the depth of the TSV structure 230 is corresponding to a thickness of the wafer 21, and the width of the TSV structure 230 is corresponding to the range of the TSV structure 230 straddled the first metal layer 211 and the metal layers 212, 213, 214.

In detail, the seal ring structures 210, 220 are corresponding to a ground electric potential (Vss) of the wafer-bonding structure 200. Also, every power supply electric potential (VCC) (not shown) of the wafers 21, 22 could be connected in parallel. A voltage from every VCC of the wafers 21, 22 is passed through a lowest resistance. Furthermore, an additional electrical connection for the seal ring structures 210, 220 is provided via the TSV structure 230 with the conductive filler 240, and an electrical path for the Vss is improved.

Via the wafer-bonding structure, it is favorable for improving the conductivity between the wafers and between the first metal layers and the metal layers. Further, it is favorable for providing a more robust mechanical protection to avoid the edge chipping and the moisture penetration during the sawing process. Also, it is favorable for improving a reliability and a bouncing noise in device operation.

The foregoing description, for purpose of explanation, has been described with reference to specific embodiments. It is to be noted that Tables show different data of the different embodiments; however, the data of the different embodiments are obtained from experiments. The embodiments were chosen and described in order to best explain the principles of the disclosure and its practical applications, to thereby enable others skilled in the art to best utilize the disclosure and various embodiments with various modifications as are suited to the particular use contemplated. The embodiments depicted above and the appended drawings are exemplary and are not intended to be exhaustive or to limit the scope of the present disclosure to the precise forms disclosed. Many modifications and variations are possible in view of the above teachings.

What is claimed is:

1. A method of forming a wafer-bonding structure, comprising:
   a wafer-bonding step, wherein at least two wafers are corresponding to and bonded to each other by bonding surfaces thereof;
   a through silicon via (TSV) forming step, wherein a TSV structure is formed on at least one side of a seal ring structure of one of the at least two wafers, a conductive filler is disposed in the TSV structure, and the TSV structure is overlapped the at least one side of the seal ring structure of one of the at least two wafers and a portion of a seal ring structure of another one of the at least two wafers;
   a forming bonding pad step, wherein a bonding pad is formed on an outer surface which is relative to the bonding surface of the wafer with the TSV structure, so as to form the wafer-bonding structure; and
   a surface treatment step, wherein the bonding surface of each of the at least two wafers is performed a surface treatment before the wafer-bonding step;
   wherein a range of the TSV structure straddled the at least one side of the seal ring structure of one of the at least two wafers is larger than or equal to 0.05 μm.

2. The method of forming the wafer-bonding structure of claim 1, wherein the at least two wafers are exposed to a nitrogen plasma or an oxygen plasma in the wafer-bonding step.

3. The method of forming the wafer-bonding structure of claim 1, wherein the at least two wafers are bonded at 250° C. to 350° C. for 1 hour to 3 hours in the wafer-bonding step.

4. The method of forming the wafer-bonding structure of claim 1, wherein the at least two seal ring structures are aligned to each other in the wafer-bonding step.

5. The method of forming the wafer-bonding structure of claim 4, wherein an alignment accuracy of the wafer-bonding step is below 300 nm.

* * * * *